(12) United States Patent
Tane et al.

(10) Patent No.: US 8,691,628 B2
(45) Date of Patent: Apr. 8, 2014

(54) METHOD OF MANUFACTURING SEMICONDUCTOR DEVICE, MANUFACTURING PROGRAM, AND MANUFACTURING APPARATUS

(75) Inventors: Yasuo Tane, Mie (JP); Yukio Katamura, Mie (JP); Atsushi Yoshimura, Mie (JP); Fumihiro Iwami, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/226,152

(22) Filed: Sep. 6, 2011

(65) Prior Publication Data

US 2012/0149151 A1 Jun. 14, 2012

(30) Foreign Application Priority Data

Dec. 10, 2010 (JP) ................... 2010-275988

(51) Int. Cl.
*H01L 21/00* (2006.01)
(52) U.S. Cl.
USPC .................... 438/109; 257/E21.499
(58) Field of Classification Search
USPC ............... 438/109, 118, 127; 257/777
See application file for complete search history.

(56) References Cited

U.S. PATENT DOCUMENTS 6,565,718 B1 * 5/2003 Chour et al. ............. 204/192.15
6,803,646 B2   10/2004 Shibue
7,906,852 B2    3/2011 Nishimura et al.
2008/0164618 A1 * 7/2008 Chow et al. .................... 257/777
2009/0140440 A1 * 6/2009 Liu et al. ........................ 257/777

FOREIGN PATENT DOCUMENTS

| JP | 2002-222914 | 8/2002 |
| JP | 2005-340415 | 12/2005 |
| JP | 2006-66816 | 3/2006 |
| JP | 2008-84972 | 4/2008 |
| JP | 2008-159607 | 7/2008 |
| JP | 2009-158739 | 7/2009 |

OTHER PUBLICATIONS

Office Action issued Oct. 17, 2012 in Korean Application No. 10-2011-93004 (With English Translation).
U.S. Appl. No. 13/091,682, filed Apr. 21, 2011, Yasuo Tane, et al.

* cited by examiner

*Primary Examiner* — Reema Patel
(74) *Attorney, Agent, or Firm* — Oblon, Spivak, McClelland, Maier & Neustadt, L.L.P.

(57) ABSTRACT

According to one embodiment, a method of manufacturing a semiconductor device, a bonding layer is formed on a first surface of a chip region of a semiconductor wafer. Semiconductor chips are singulated along a dicing region. The semiconductor chips are stacked stepwise via the bonding layer. In formation of the bonding layer of the semiconductor chip, in at least a part of a first region of the first surface not in contact with the other semiconductor chip in a stacked state, a projected section where the bonding layer is formed thicker than the bonding layer in a second region that is in contact with the other semiconductor chip is provided.

14 Claims, 12 Drawing Sheets

METHOD OF MANUFACTURING SEMICONDUCTOR DEVICE, MANUFACTURING PROGRAM, AND MANUFACTURING APPARATUS

CROSS-REFERENCE TO RELATED APPLICATIONS

This application is based upon and claims the benefit of priority from the prior Japanese Patent Application No. 2010-275988, filed on Dec. 10, 2010; the entire contents of which are incorporated herein by reference.

FIELD

Embodiments described herein relate generally to a method of manufacturing a semiconductor device, a manufacturing program, and a manufacturing apparatus.

BACKGROUND

In a semiconductor device used while including a semiconductor memory chip such as a NAND flash memory, the semiconductor memory chip is mounted on a substrate on which a circuit pattern is formed. In such a semiconductor device, in some case, a plurality of memory chips are stacked stepwise on the substrate according to a request for high-density packaging.

When the semiconductor chips are stacked stepwise, improvement of the intensity of chips (so-called bonding intensity) is desired to connect electrodes in a region of an upper semiconductor chip not in contact with a lower semiconductor chip.

DETAILED DESCRIPTION

In general, according to one embodiment, a method of manufacturing a semiconductor device, a bonding layer is formed on a first surface of a chip region of a semiconductor wafer on which a plurality of chip regions are formed via a dicing region. The semiconductor wafer is divided along the dicing region to singulate semiconductor chips having the chip regions and the semiconductor chips are stacked stepwise via the bonding layer. In formation of the bonding layer, in at least a part of a first region of the first surface not in contact with the other semiconductor chip in a stacked state, a projected section where the bonding layer is formed thicker than the bonding layer in a second region that is in contact with the other semiconductor chip is provided.

Exemplary embodiments of a method of manufacturing a semiconductor device, a manufacturing program, and a manufacturing apparatus will be explained below in detail with reference to the accompanying drawings. The present invention is not limited to the following embodiments.

Figure 1:
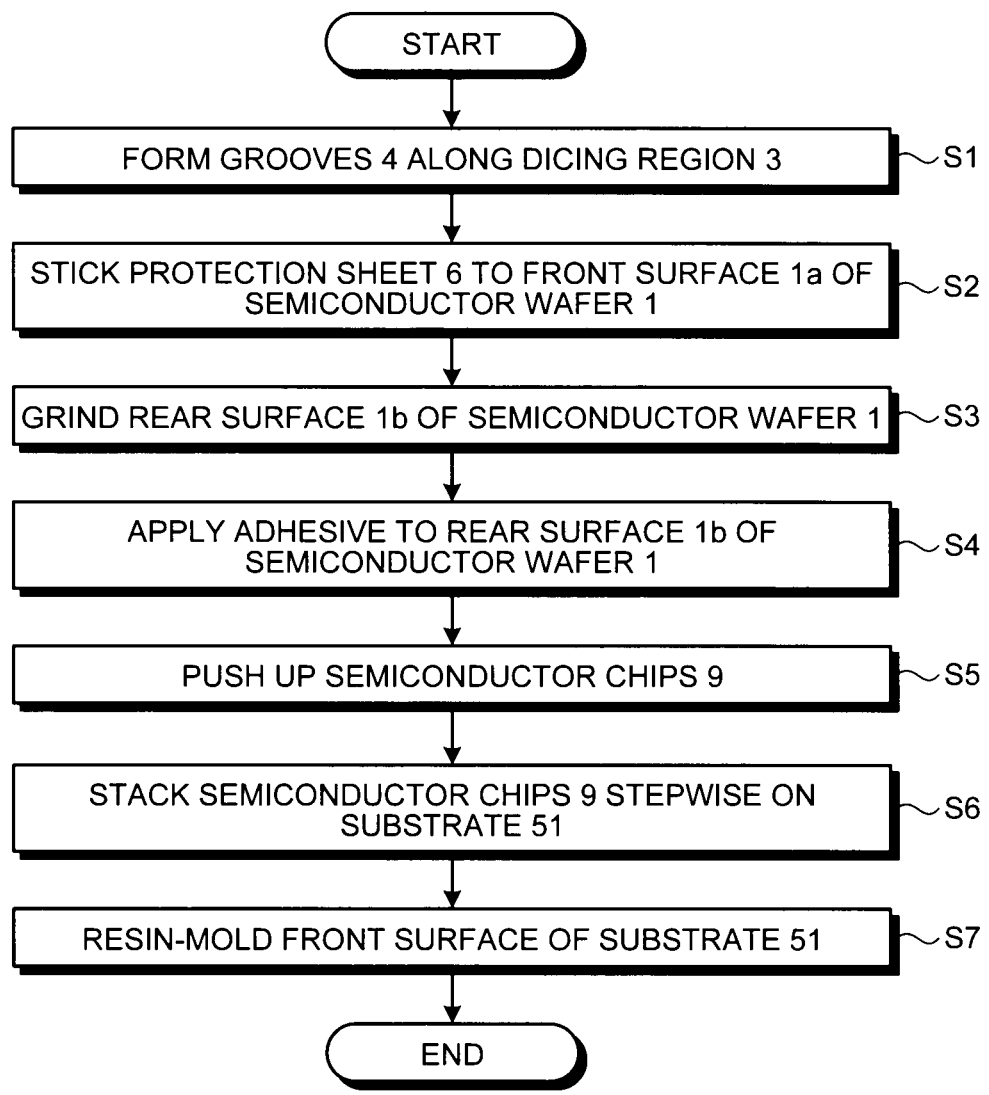
FIG. 1 is a flowchart for explaining a method of manufacturing a semiconductor device according to an embodiment.
Figure 2:
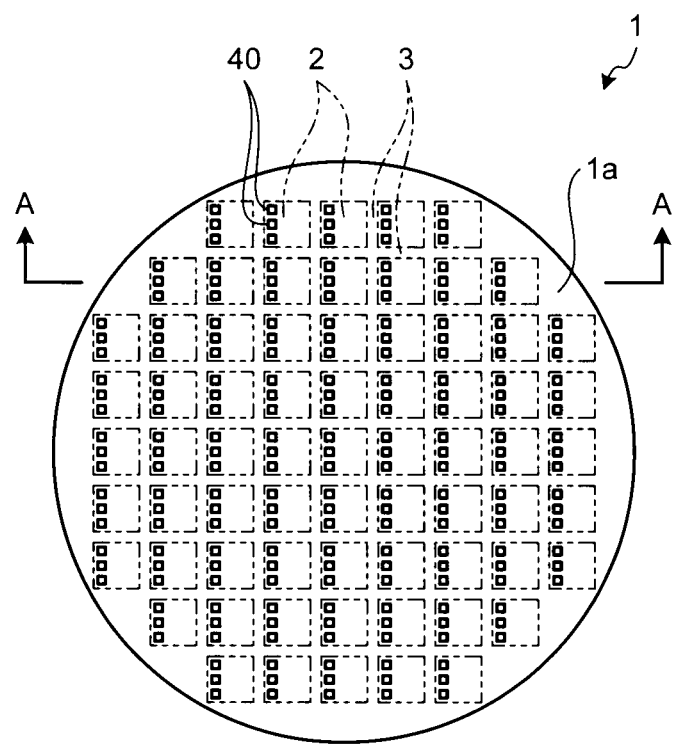
FIG. 2 is a diagram of a semiconductor wafer viewed from the front surface side.
Figure 3:
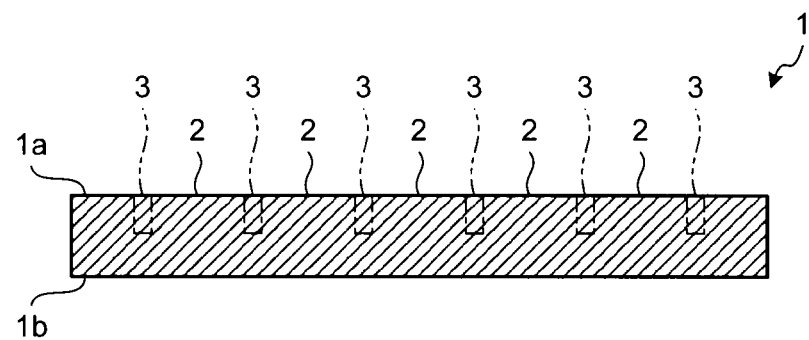
FIG. 3 is an arrow sectional view taken along line A-A shown in FIG. 2.
Figure 4:
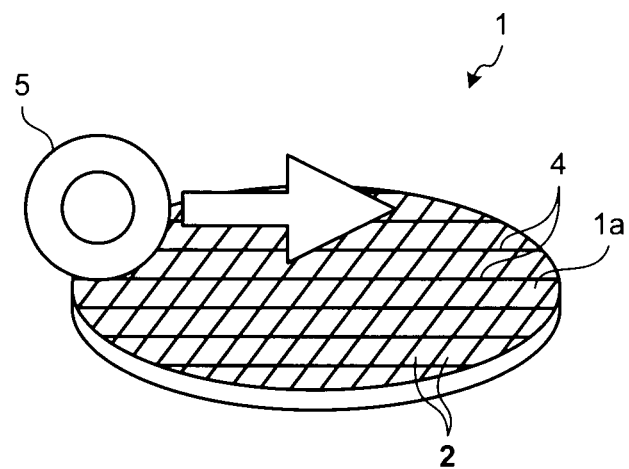
FIG. 4 is a diagram for explaining a step of the method of manufacturing a semiconductor device according to the embodiment.
Figure 5:
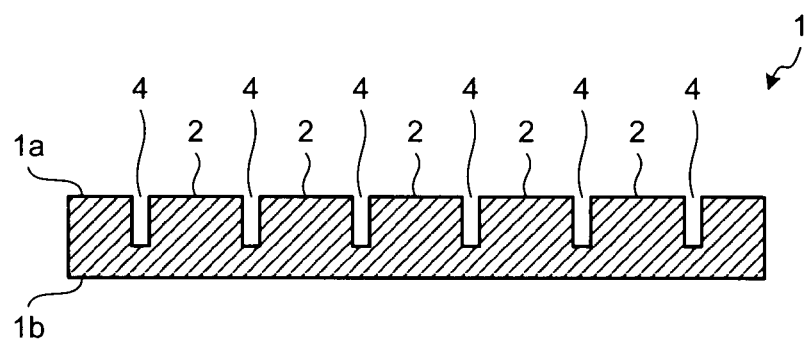
FIG. 5 is an arrow sectional view taken along line A-A shown in FIG. 2, wherein a state after the step of FIG. 4 is shown.
Figure 6:
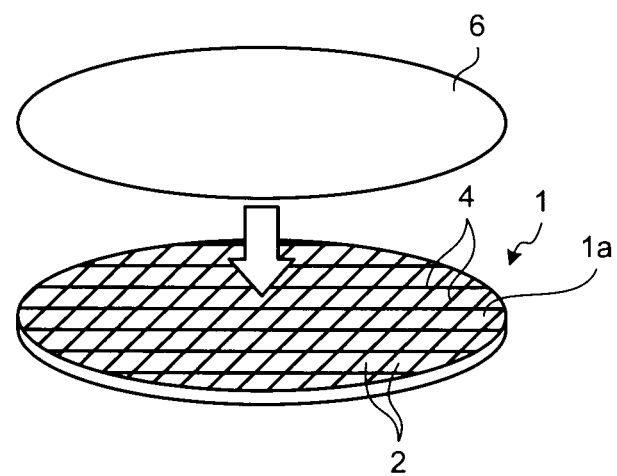
FIG. 6 is a diagram for explaining a step of the method of manufacturing a semiconductor device according to the embodiment.
Figure 7:
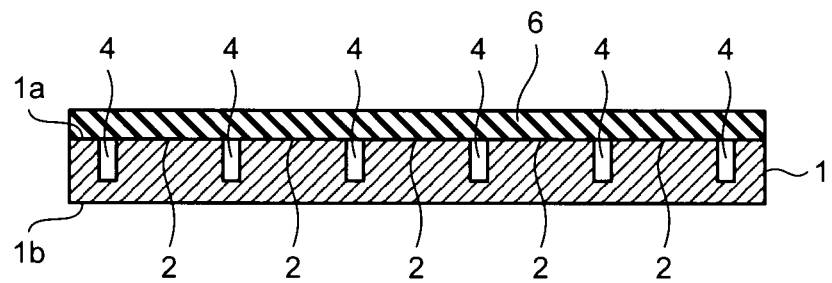
FIG. 7 is an arrow sectional view taken along line A-A shown in FIG. 2, wherein a state after the step of FIG. 6 is shown.
Figure 8:
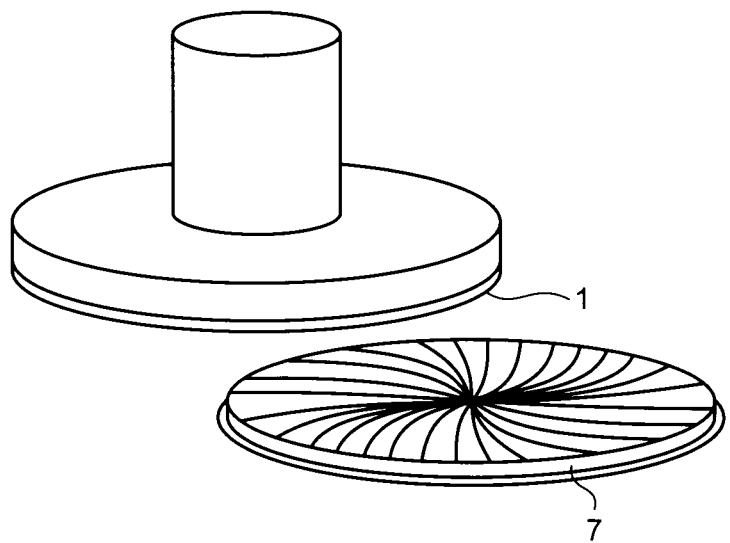
FIG. 8 is a diagram for explaining a step of the method of manufacturing a semiconductor device according to the embodiment.
Figure 9:
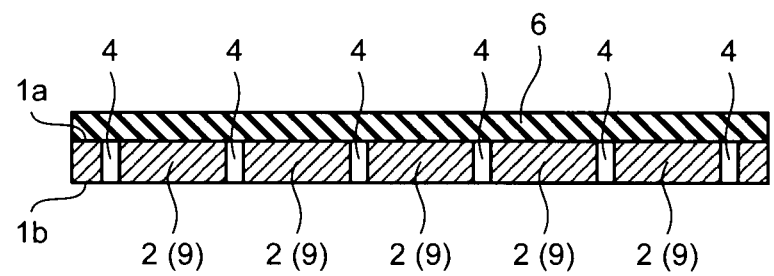
FIG. 9 is an arrow sectional view taken along line A-A shown in FIG. 2, wherein a state after the step of FIG. 8 is shown.

FIG. 1 is a flowchart for explaining the method of manufacturing a semiconductor device according to the embodiment. FIG. 2 is a diagram of a semiconductor wafer viewed from the front surface side. FIG. 3 is an arrow sectional view taken along line A-A shown in FIG. 1. FIG. 4 is a diagram for explaining a step of the method of manufacturing a semiconductor device according to the embodiment. FIG. 5 is an arrow sectional view taken along line A-A shown in FIG. 1, wherein a state after the step of FIG. 4 is shown. FIG. 6 is a diagram for explaining a step of the method of manufacturing a semiconductor device according to the embodiment. FIG. 7 is an arrow sectional view taken along line A-A shown in FIG. 1, wherein a state after the step of FIG. 6 is shown. FIG. 8 is a diagram for explaining a step of the method of manufacturing a semiconductor device according to the embodiment. FIG. 9 is an arrow sectional view taken along line A-A shown in FIG. 1, wherein a state after the step of FIG. 8 is shown.

Figure 10:
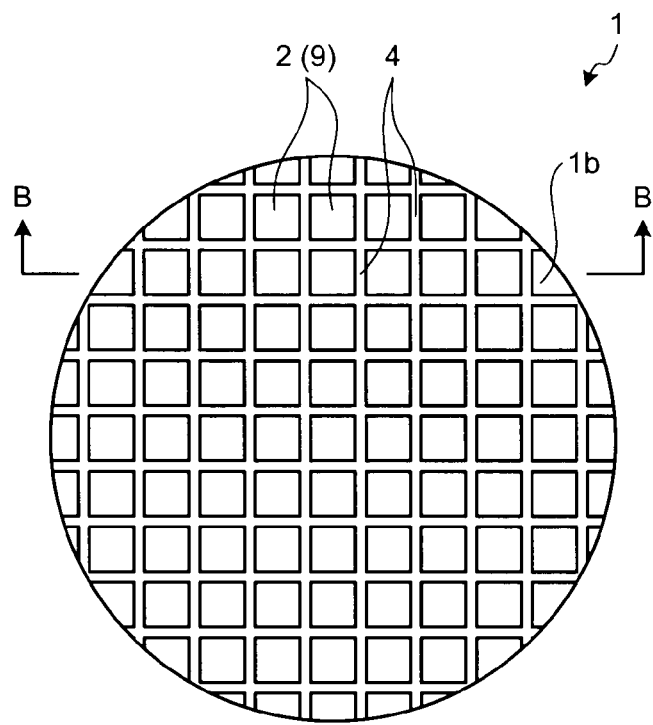
FIG. 10 is a diagram of the semiconductor wafer viewed from the rear surface side, wherein a state after the step of FIG. 8 is shown.
Figure 11:
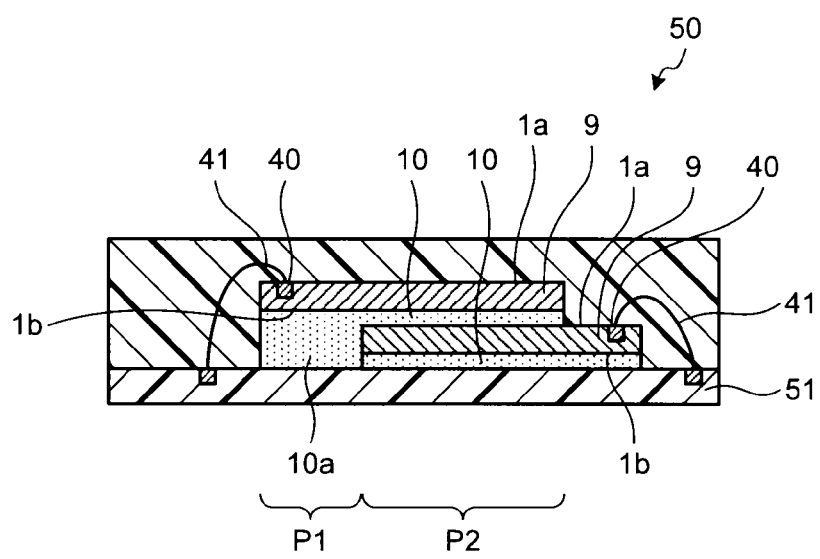
FIG. 11 is a sectional view of a semiconductor device according to the embodiment.

FIG. 10 is a diagram of the semiconductor wafer viewed from the rear surface side, wherein a state after the step of FIG. 8 is shown. FIG. 11 is a sectional view of a semiconductor device according to the embodiment.

As shown in FIGS. 2 and 3, a semiconductor wafer 1 on which a semiconductor surface and the like are formed on the front surface side is prepared. The semiconductor wafer 1 includes a front surface (a second surface) 1a on which a plurality of chip regions 2 are provided and a rear surface (a first surface) 1b on the opposite side of the front surface 1a.

A semiconductor element section including a semiconductor circuit and a wiring layer is formed in the chip region 2. A dicing region 3 is provided among the chip regions 2. The semiconductor wafer 1 is cut along the dicing region 3, whereby the chip regions 2 can be divided from one another to singulate semiconductor chips 9.

When a semiconductor device 50 is manufactured, first, as shown in FIGS. 4 and 5, grooves 4 are formed on the semiconductor wafer 1 along the dicing region 3 from the front surface 1a side (step S1). The grooves 4 of the semiconductor wafer 1 are formed using, for example, a blade 5 having blade thickness corresponding to the width of the dicing region 3.

The depth of the grooves 4 is set smaller than the thickness of the semiconductor wafer 1 and larger than the thickness at the time of completion of the singulated semiconductor chips 9. The grooves 4 can be formed by etching or the like. The grooves 4 having such depth are formed on the semiconductor wafer 1, whereby the chip regions 2 are sectioned from one another in a state corresponding to the thickness of the semiconductor chips.

As shown in FIGS. 6 and 7, a protection sheet 6 is stuck on the front surface 1a of the semiconductor wafer 1 on which the grooves 4 are formed (step S2). The protection sheet 6 protects the semiconductor element section provided in the chip region 2 when the rear surface 1b of the semiconductor wafer 1 is ground at a later step. The protection sheet 6 maintains the shape of the semiconductor wafer 1 after the chip regions 2 are singulated in the grinding step for the rear surface 1b. As the protection sheet 6, a resin sheet such as a polyethylene terephthalate (PET) sheet having an adhesive layer is used.

As shown in FIGS. 8 and 9, the rear surface 1b of the semiconductor wafer 1 on which the protection sheet 6 is stuck is ground (step S3). For example, as shown in FIGS. 8 and 9, the rear surface 1b of the semiconductor wafer 1 is mechanically ground using a lapping surface plate 7.

The grinding step for the rear surface 1b of the semiconductor wafer 1 is carried out until the grooves 4 formed from the front surface 1a side are exposed from the rear surface side. The rear surface 1b of the semiconductor wafer 1 is ground in this way, whereby the chip regions 2 are divided and the semiconductor chips 9 are singulated (see FIG. 10 as well).

At this stage, the semiconductor chips 9 are not broken into pieces because the semiconductor chips 9 are held by the protection sheet 6. As a whole, the wafer shape is maintained. In other words, the semiconductor chips 9 are singulated from one another while the shape of the semiconductor wafer 1 is maintained by the protection sheet 6. The grooves 4 are present among the singulated semiconductor chips 9.

An adhesive is applied to the rear surface 1b of the semiconductor wafer 1 (step S4). The application of the adhesive is performed by, for example, an application apparatus explained in detail later. The semiconductor chips 9 are pushed up from the semiconductor wafer 1 via the protection sheet 6 (step S5). The semiconductor chips 9 are stacked stepwise on a substrate 51, on which a circuit pattern is formed, while being shifted in one direction parallel to the front surface 1a and the rear surface 1b (step S6). The front surface of the substrate 51 is resin-molded (step S7), whereby the semiconductor device 50 is manufactured (see FIG. 11 as well).

Figure 12:
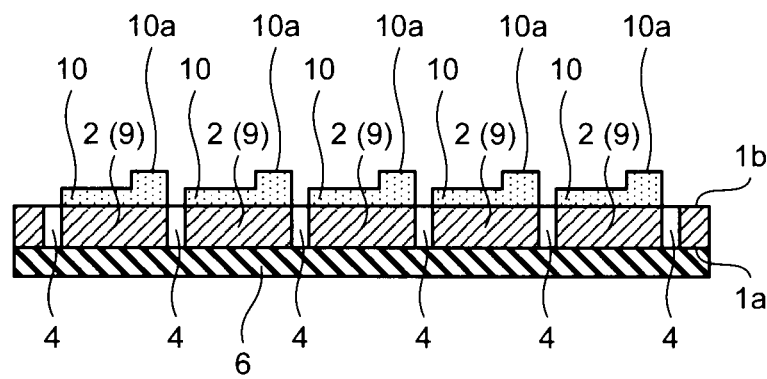
FIG. 12 is an arrow sectional view taken along line B-B shown in FIG. 10, wherein a state in which an adhesive is applied to the rear surface is shown.

The application of the adhesive to the rear surface 1b of the semiconductor wafer 1 is explained in detail. As shown in FIG. 12, a bonding layer 10 is formed on the rear surface 1b of the semiconductor wafer 1 by the application of the adhesive at step S4. The semiconductor chip 9 is bonded to the lower stacked semiconductor chip 9 via the bonding layer 10.

Figure 13:
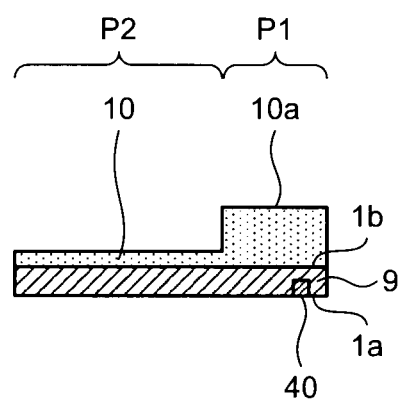
FIG. 13 is a sectional view of a semiconductor chip separated from the semiconductor wafer.
Figure 14:
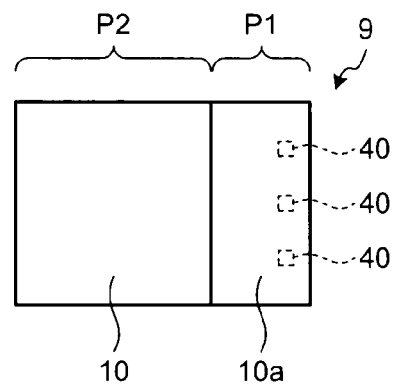
FIG. 14 is a diagram of the semiconductor chip viewed from the rear surface side.

FIG. 13 is a sectional view of the semiconductor chip 9 separated from the semiconductor wafer. FIG. 14 is a diagram of the semiconductor chip viewed from the rear surface 1b side. As shown in FIGS. 13 and 14, the thickness of the bonding layer 10 is not uniform over the entire rear surface 1b of the semiconductor chip 9. A projected section 10a formed thicker than the other region is provided in a part of the rear surface 1b. A step is not always provided between a section where the thickness of the bonding layer 10 is small and the projected section 10a. In some case, the thickness of the bonding layer 10 smoothly changes. The thickness of the projected section 10a only has to be at least larger than the thickness of the other section.

The projected section 10a is formed to be located, on the rear surface 1b side of the semiconductor chip 9, in a region (a first region) P1 not in contact with the lower stacked semiconductor chip 9. In this embodiment, the entire region P1 is filled with the projected section 10a. In the projected section 10a, the bonding layer 10 is formed thicker than a region (a second region) P2 in contact with the lower stacked semiconductor chip 9. The thickness of the projected section 10a is thickness for setting the projected section 10a in contact with the front surface of the substrate 51 when the semiconductor chip 9 is stacked.

For example, when the thickness of the semiconductor chip 9 is 20 micrometers and the thickness of the bonding layer 10 in the region P2 is 10 micrometers, the thickness of the boding layer in the projected section 10a is about 40 micrometers (the height of the step is 30 micrometers). The bonding layer 10 is formed by applying an adhesive containing resin and a solvent to the rear surface 1b of the semiconductor wafer 1 and semi-hardening the adhesive. The shapes of the entire region P1 and the projected section 10a do not have to completely coincide with each other. This is because the projected section 10a is deformed by a load during die bonding, a load in a resin sealing step, or the like and the shape of the projected section 10a coincides with the shape of the region P1.

As a method of singulating the semiconductor chips 9, so-called dicing before grinding for performing formation (dicing) of grooves using the blade 5 at step S1 earlier than the grinding at step S3 is explained above as an example. However, the semiconductor chips 9 can be singulated by so-called dicing after grinding for performing dicing after grinding.

Figure 15:
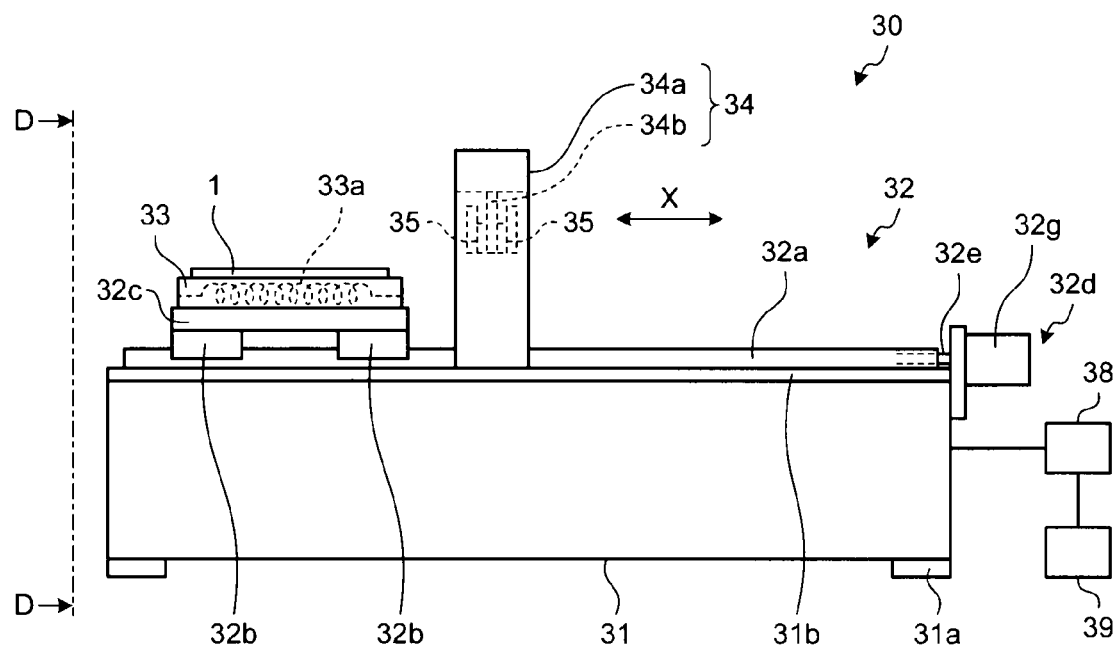
FIG. 15 is a side view of an application apparatus.
Figure 16:
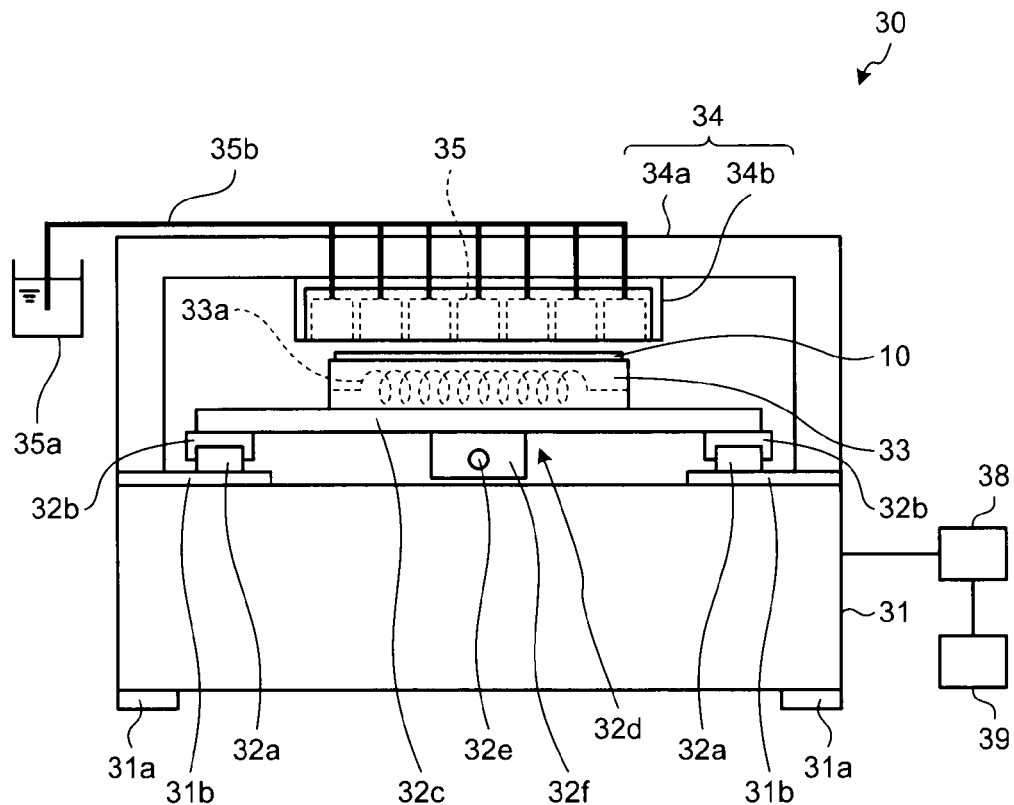
FIG. 16 is an arrow view taken along line D-D shown in FIG. 15.

An application apparatus for applying the adhesive to the semiconductor wafer 1 is explained. FIG. 15 is a side view of the application apparatus functioning as a semiconductor manufacturing apparatus. FIG. 16 is an arrow view taken along line D-D shown in FIG. 15. A base 31, a moving section 32, a placing section 33, a supporting section 34, an ejecting section 35, and the like are provided in an application apparatus 30.

The base 31 assumes a substantially rectangular parallelepiped shape. Legs 31a are provided on the bottom surface of the base 31. A base plate 31b is provided on a surface on a side opposed to the bottom surface. Track rails 32a, moving blocks 32b, an attaching section 32c, a driving section 32d, and the like are provided in the moving section 32.

The track rails 32a assume a substantially rectangular sectional shape and are provided on the upper surface of the base plate 31b. The track rails 32a extend in a longitudinal direction of the base plate 31b as shown in FIG. 15. As shown in FIG. 16, the track rails 32a are respectively provided on both end sides of the base 31.

The moving blocks 32b assumes a substantially inverse U-shaped sectional shape and are attached to the track rails 32a via a not-shown plurality of balls. The moving blocks 32b can freely reciprocatingly move on the track rails 32a while striding across the track rails 32a. The attaching section 32c assumes a flat plate shape and is provided on the upper surfaces of the moving blocks 32b.

A ball screw section 32e, a nut section 32f, a driving motor 32g, and the like are provided in the driving section 32d. The ball screw section 32e is provided to extend in the longitudinal direction of the base plate 31b as shown in FIG. 15. Both ends of the ball screw section 32e are rotatably attached to the base 31. The nut section 32f is provided on the lower surface of the attaching section 32c as shown in FIG. 16 and is screwed with the ball screw section 32e. A driving motor 32g such as a servo motor is connected to one end of the ball screw section 32e. Therefore, if the ball screw section 32e is rotated by the driving motor 32g, the attaching section 32c is reciprocatingly driven in a direction of an arrow X shown in FIG. 15.

An electrostatic chuck, a vacuum chuck, or the like not shown in the figure is incorporated in the placing section 33. The semiconductor wafer 1 (the semiconductor chips 9) can be placed and held on a placing surface of the placing section 33. A heating section 33a such as a heater is incorporated in the placing section 33. The placing section 33 can heat the adhesive applied to the semiconductor wafer 1 held on the placing section 33. The heating section 33a only has to be capable of heating the adhesive. For example, the heating section 33a can be a heating section that circulates a heating medium to perform heating. The heating section 33a can be provided apart from the placing section 33. For example, an infrared heater or the like can be provided in a position where the infrared heater can irradiate the semiconductor wafer 1 held on the placing section 33. In other words, the heating section heats the adhesive applied on the semiconductor wafer 1 and semi-hardens the adhesive.

The supporting section 34 assumes a substantially inverse U-shape and is erected from the base plate 31b to stride across the pair of track rails 32a. An attaching section 34b is provided to project from a beam section 34a of the supporting section 34. The ejecting section 35 is attached to the attaching section 34b.

The ejecting section 35 ejects the adhesive containing resin and a solvent to the semiconductor wafer 1. The ejecting section 35 ejects the adhesive to the semiconductor wafer 1 according to an inkjet method. As the inkjet method, there are, for example, a "thermal type" for generating air bubbles through heating and ejecting liquid using a film boiling phenomenon and a "piezoelectric type" for ejecting liquid using bending displacement of piezoelectric elements. Any one of these types can be adopted. As the ejecting section 35, a known inkjet head that ejects ink according to the inkjet method can be adopted. Therefore, explanation of a detailed configuration of the ejecting section 35 is omitted.

A storing section 35a is connected to the ejecting section 35 via a pipe 35b. The adhesive can be supplied to the ejecting section 35. The adhesive having adjusted viscosity is stored in the storing section 35a. In this case, as explained above, to suppress clogging of an ejection nozzle, it is desirable to reduce viscosity at 25° C. of the adhesive. The supply of the adhesive from the storing section 35a to the ejecting section 35 can be performed using a position head or can be performed using liquid feeding means such as a pump.

A control section 38 that controls ejection timing, an ejection amount, and the like from the ejecting section 35 is provided. For example, in the case of the ejecting section 35 of the "piezoelectric type", the control section 38 changes a voltage applied to the piezoelectric elements and controls an operation amount of the piezoelectric elements to control the size of a droplet of the adhesive ejected from ejection nozzles opposed to the piezoelectric elements, i.e., an ejection amount of the adhesive. Therefore, the thickness of the adhesive deposited in a film shape can be set to thickness equal to or smaller than 1 micrometer. The control section 38 controls driving of the driving motor 32g and ejection timing of the adhesive from the ejecting section 35 to apply the adhesive to a desired region on the semiconductor wafer 1.

The control section 38 causes, according to a computer program stored in the storing section 39, the application apparatus to execute the application of the adhesive. For example, in the computer program stored in the storing section 39, information indicating ranges of the regions P1 and P2 and information indicating an ejection amount of the adhesive can be described. Alternatively, table information indicating the regions P1 and P2 and an ejection amount of the adhesive for forming the regions P1 and P2 can be stored in the storing section 39. The control section 38 can read out necessary information from the storing section 39 according to a description of the computer program and control the driving motor 32g and the ejecting section 35.

The bonding layer 10 is formed by semi-hardening the adhesive applied by the application apparatus 30. For example, when the adhesive is applied to the region P1, the projected section 10a having thickness larger than the thickness of the region P2 can be formed by increasing an ejection amount of the adhesive or increasing the number of times of application. A method of forming the projected section 10a can be collective formation for applying the adhesive for the entire bonding layer 10 including the projected section 10a and then semi-hardening the adhesive to form the bonding layer 10. The method of forming the projected section 10a can be divided formation for applying the adhesive to the regions P1 and P2 at the thickness of the adhesive layer 10 in the region P2 and semi-hardening the adhesive and then applying the adhesive to the region P1 again and semi-hardening the adhesive to from the projected section 10a.

For example, in the collective formation, improvement of production efficiency can be realized by reducing man-hour compared with the divided formation. On the other hand, even if formation of the projected section 10a is difficult in the collective formation because the viscosity of the adhesive is low, in the divided formation, it is easy to form the projected section 10a.

As explained above, because the projected section 10a is formed in the region P1 in the bonding layer 10 formed on the rear surface 1b side of the semiconductor chip 9, the thickness of the bonding layer 10 increases and the strength of the semiconductor chip 9 in the region P1 is improved. When the semiconductor chips 9 are stacked stepwise on the substrate 51, because the region P1 is not bonded to the lower semiconductor chip 9, the strength tends to be low compared with the region P2. On the other hand, in this embodiment, because improvement of the strength of the semiconductor chip 9 in the region P1 is realized by the projected section 10a, when the semiconductor chips 9 are stacked stepwise on the substrate 51, deformation such as bending less easily occurs in the region P1.

In this embodiment, because the projected section 10a is in contact with the substrate 51, when force acting toward the substrate 51 is applied to the region P1, the region P1 can be supported by the bonding layer 10 (the projected section 10a). Therefore, it is possible to more surely suppress deformation such as bending from occurring in the semiconductor chip 9.

The projected section 10a that fills a gap between the substrate 51 and the semiconductor chip 9 is collectively formed at the step of forming the bonding layer 10. Therefore, man-hour can be reduced compared with man-hour required for stacking the semiconductor chip 9 on the substrate 51 and then closing the gap. Facilitation of work can also be realized.

Because the strength of the region P1 is increased, it is unnecessary to set the thickness of the semiconductor chip 9 larger than the thickness of the other semiconductor chip 9. As a result, the thicknesses of the stacked semiconductor chips 9 can be set substantially equal in the respective semiconductor chips 9. The height of the semiconductor device can be reduced. Therefore, it is unnecessary to change, for each wafer, a condition for grinding the rear surface 1b of the semiconductor wafer 1 (step S3). Therefore, a manufacturing process can be simplified. The semiconductor device 50 can be manufactured only with chips singulated from the same wafer. As a result, a flexibility of selection of the semiconductor chip 9 can be improved.

An electrode pad 40 is formed along one side in plan view on the surface of the semiconductor chip 9. The electrode pad 40 is electrically connected, through wire bonding by a metal wire 41, to a connection pad formed on the substrate 51 and the electrode pad 40 formed on the other semiconductor chip 9. The electrode pad 40 is formed on the rear side of the region P1. In such a configuration, when the metal wire 41 is wire-bonded to the electrode pad 40, force acting toward the substrate 51 side tends to be applied to the region P1. However, in this embodiment, improvement of the strength of the semiconductor chip 9 in the region P1 is realized by the projected section 10a formed in the bonding layer 10. As a result, deformation of the semiconductor chip 9 less easily occurs even during the wire bonding.

Because the application apparatus 30 that applies the adhesive according to the inkjet method is used, it is possible to variously set the shape of a region to which the adhesive is applied and application thickness and it is easy to form a complicated shape like the adhesive layer 10 in which the projected section 10a is formed.

Figure 17:
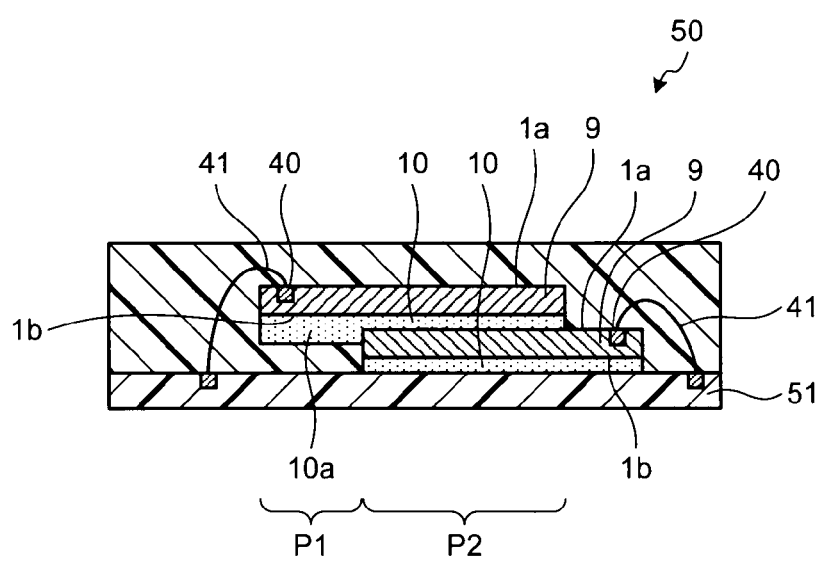
FIG. 17 is a sectional view of a semiconductor device according to a first modification of the embodiment.

FIG. 17 is a sectional view of a semiconductor device according to a first modification of the embodiment. As shown in FIG. 17, in the first modification, when the semiconductor chip 9 is stacked on the substrate 51, the projected section 10a is formed at thickness for not setting the projected section 10a in contact with the substrate 51. Even when the projected section 10a is not set in contact with the substrate 51 in this way, if a side surface of the projected section 10a and a side surface of the lower semiconductor chip 9 are bonded, an area for absorbing impact applied during bonding increases. As a result, it is possible to realize improvement of the strength of the semiconductor chip 9 in the region P1 using the thickness (the projected section 10a) of the bonding layer 10.

Figure 18A:
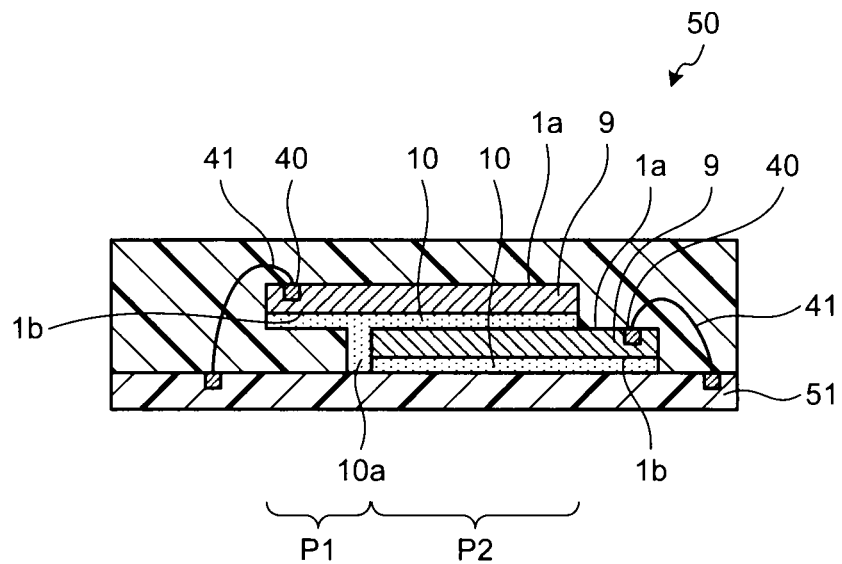
FIG. 18A is a sectional view of a semiconductor device according to a second modification of the embodiment.
Figure 19:
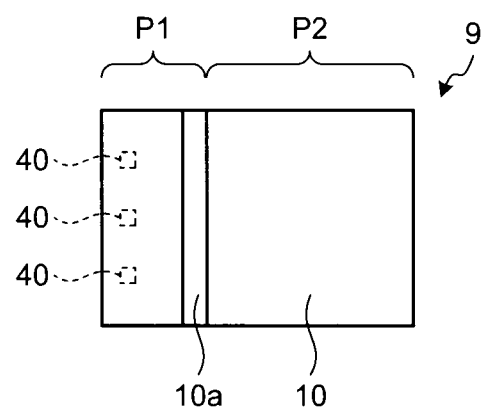
FIG. 19 is a diagram of a semiconductor chip included in the semiconductor device shown in FIG. 18 viewed from the rear surface side.

FIG. 18A is a sectional view of a semiconductor device according to a second modification of the embodiment. FIG. 19 is a diagram of a semiconductor chip included in the semiconductor device shown in FIG. 18A viewed from the rear surface side. As shown in FIGS. 18A and 19, in the second modification, the projected section 10a is formed not over the entire region P1 and is formed in a boundary section between the region P1 and the region P2. In other words, the projected section 10a does not need to be formed right under the electrode pad 40. The projected section 10a is in contact with a side surface of the lower stacked semiconductor chip 9. Improvement of the strength of the semiconductor chip 9 can be realized by contact with the lower stacked semiconductor chip 9 and an increase in the thickness of the bonding layer 10 by the projected section 10a. Because the projected section 10a is formed not over the entire region P1, it is possible to suppress an amount of use of the adhesive and effectively utilize resources. The projected section 10a can be formed at thickness for not setting the projected section 10a in contact with the substrate 51.

Figure 18B:
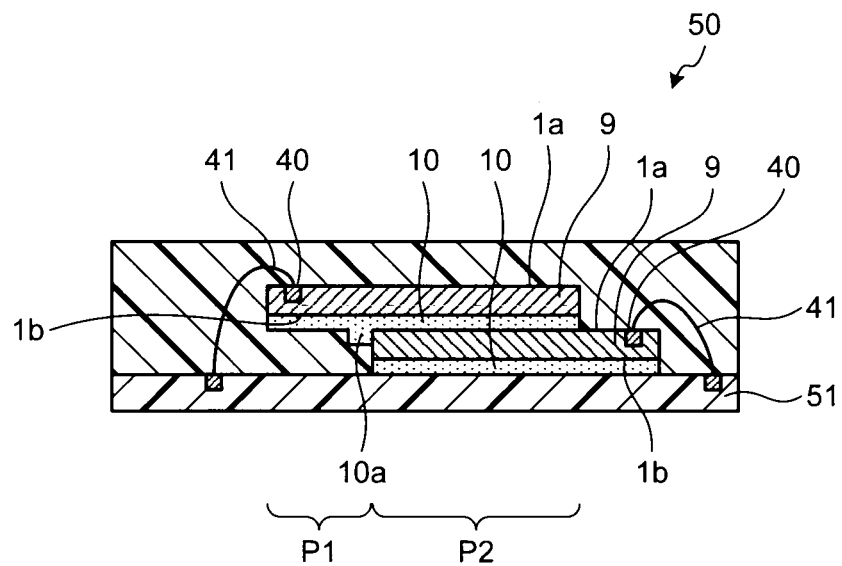
FIG. 18B is a sectional view of a semiconductor device according to a third modification of the embodiment.

FIG. 18B is a sectional view of a semiconductor device according to a third modification of the embodiment. As shown in FIG. 18B, it is also possible to combine the configurations shown in FIGS. 17 and 18A. With a structure shown in FIG. 18B, it is also possible to more surely suppress deformation such as bending from occurring in the semiconductor chip 9.

Figure 20:
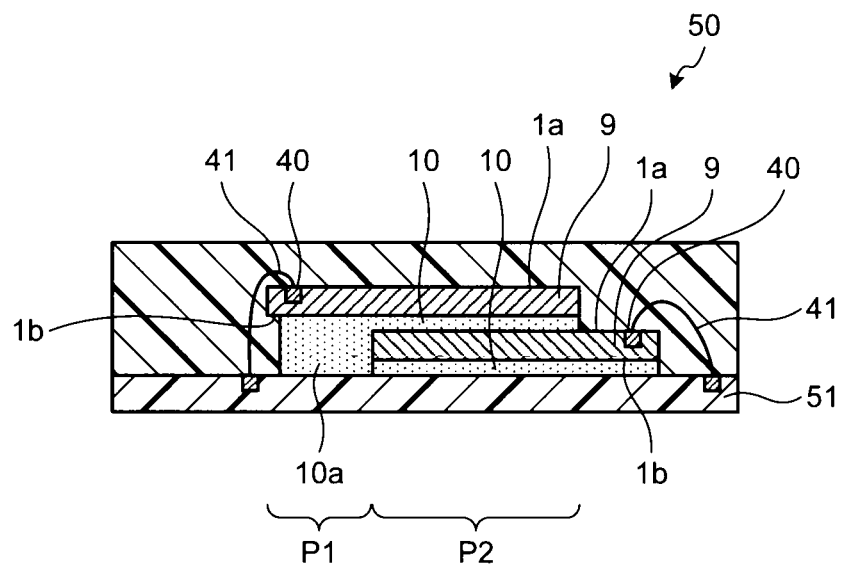
FIG. 20 is a sectional view of a semiconductor device according to a fourth modification of the embodiment.
Figure 21:
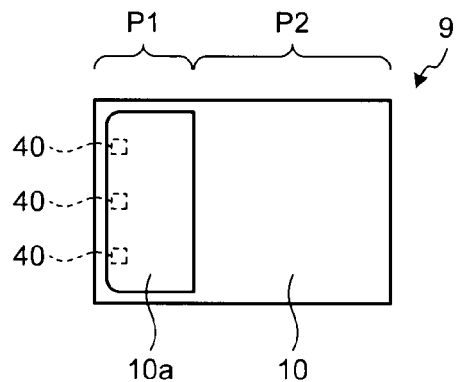
FIG. 21 is a diagram of a semiconductor chip included in the semiconductor device shown in FIG. 20 viewed from the rear surface side.

FIG. 20 is a sectional view of a semiconductor device according to a fourth modification of the embodiment. FIG. 21 is a diagram of a semiconductor chip included in the semiconductor device shown in FIG. 20 viewed from the rear surface side. As shown in FIGS. 20 and 21, in the fourth modification, although the projected section 10a is formed over substantially the entire region P1, the projected section 10a is not formed in an outer edge section in plan view of the semiconductor chip 9. In this way, the projected section 10a is not formed in the outer edge section of the semiconductor chip 9. This makes it easy to suppress, when the projected section 10a is set in contact with the substrate 51, the spread of the projected section 10a to be smaller than a projection area of the region P1 on the substrate 51. This is because, even if the electrode pad 40 of the substrate 51 is arranged near the semiconductor chip 9 viewed from an upper surface direction, the electrode pad 40 of the substrate 51 is not covered by the projected section 10a of the adhesive 10. This makes it possible to suppress deterioration in a flexibility of circuit design of the substrate 51.

Figure 22:
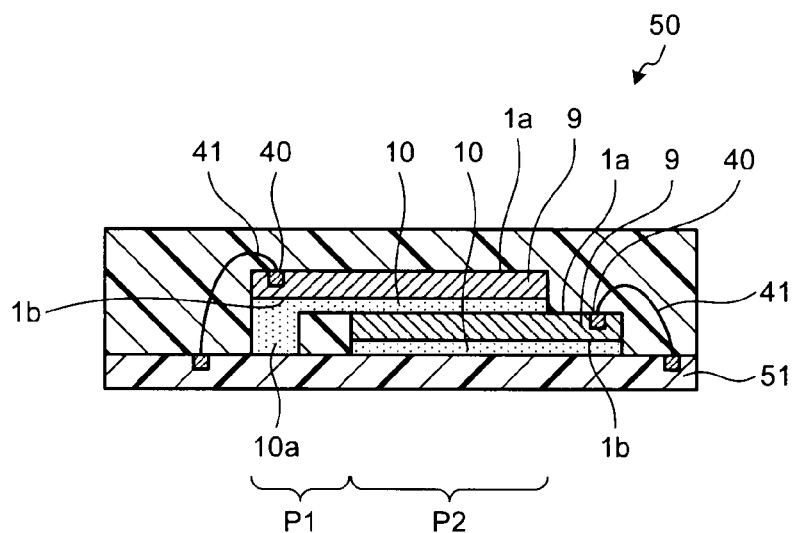
FIG. 22 is a sectional view of a semiconductor device according to a fifth modification of the embodiment.
Figure 23:
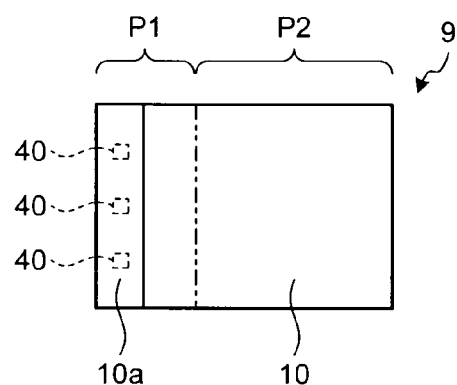
FIG. 23 is a diagram of a semiconductor chip included in the semiconductor device shown in FIG. 22 viewed from the rear surface side.

FIG. 22 is a sectional view of a semiconductor device according to a fifth modification of the embodiment. FIG. 23 is a diagram of a semiconductor chip included in the semiconductor device shown in FIG. 22 viewed from the rear surface side. As shown in FIGS. 22 and 23, in the fifth modification, the projected section 10a is formed not over the entire region P1. The projected section 10a is formed along an edge in a position away from a boundary with the region P2 among edges in plan view of the semiconductor chip 9. The projected section 10a is formed at thickness for setting the projected section 10a in contact with the substrate 51.

In this way, the projected section 10a is formed along the edge in the position away from the boundary with the region P2 and the projected section 10a is set in contact with the substrate 51. Consequently, when force acting toward the substrate 51 side is applied to the region P1, it is possible to support the region P1 with the projected section 10a and suppress deformation of the semiconductor chip 9. Further, it is possible to suppress an amount of use of the adhesive and effectively utilize resources. The projected section 10a is desirably formed in a region right under the electrode pad 40. As a result, it is possible to support the region P1 with the projected section 10a and effectively prevent deformation of the semiconductor chip 9.

While certain embodiments have been described, these embodiments have been presented by way of example only, and are not intended to limit the scope of the inventions. Indeed, the novel methods, programs, and apparatuses described herein may be embodied in a variety of other forms; furthermore, various omissions, substitutions and changes in the form of the methods, programs, and apparatuses described herein may be made without departing from the sprit of the inventions. The accompanying claims and their equivalents are intended to cover such forms or modifications as would fall within the scope and spirit of the inventions.

What is claimed is:

1. A method of manufacturing a semiconductor device, comprising:
   forming bonding layers on first surfaces of a plurality of semiconductor chips;
   stacking the semiconductor chips stepwise on a substrate via the bonding layers;
   providing, in the formation of the bonding layer of the semiconductor chip, at least in a part of a first region of the first surface not in contact with an upper surface of the other semiconductor chip in a stacked state, a projected section where the bonding layer is formed thicker than a second region that is in contact with the other semiconductor chip,
   wherein thickness of the bonding layer in the projected section is thickness for setting the projected section in contact with the substrate.

2. The method of manufacturing a semiconductor device according to claim 1, wherein a side surface of the projected section is in contact with a side surface of the other semiconductor chip.

3. The method of manufacturing a semiconductor device according to claim 1, wherein the projected section is formed over the entire second region.

4. The method of manufacturing a semiconductor device according to claim 1, wherein
   the projected section is formed to avoid an outer edge section of the semiconductor chip in plan view.

5. The method of manufacturing a semiconductor device according to claim 1, wherein
   an electrode pad is formed on a second surface, which is an opposite surface of the first surface, of the semiconductor chip,
   the projected section is formed in a region right under the electrode pad.

6. A manufacturing program for a semiconductor device for controlling an application apparatus to manufacture a semiconductor device, the application apparatus including a placing section on which a semiconductor chip is placed and an ejecting section that ejects an adhesive to a first surface of the semiconductor chip placed on the placing section and forms a bonding layer,
   the manufacturing program causing the ejecting section to eject the adhesive, to stack a plurality of the semiconductor chips on a substrate stepwise, and to form, in at least a part of a first region of the first surface not in contact with an upper surface of the other semiconductor chip, a projected section having thickness of the bonding layer larger than thickness of the bonding layer in a second region that is in contact with the other semiconductor chip,
   wherein thickness of the bonding layer in the projected section is thickness for setting the projected section in contact with the substrate.

7. The manufacturing program for a semiconductor device according to claim 6, wherein a side surface of the projected section is in contact with a side surface of the other semiconductor chip.

8. The manufacturing program for a semiconductor device according to claim 6, wherein the projected section is formed over the entire second region.

9. The manufacturing program for a semiconductor device according to claim 6, wherein
   the projected section is formed to avoid an outer edge section of the semiconductor chip in plan view.

10. The manufacturing program for a semiconductor device according to claim 6, wherein
    an electrode pad is formed on a second surface, which is an opposite surface of the first surface, of the semiconductor chip,
    the projected section is formed in a region right under the electrode pad.

11. A manufacturing apparatus for a semiconductor device, comprising:
    a placing section on which a semiconductor chip is placed;
    an ejecting section that ejects an adhesive to a first surface of the semiconductor chip placed on the placing section and forms a bonding layer;
    a control section that controls the ejecting section to form a plurality of the semiconductor chips stacked on a substrate stepwise, in at least a part of a first region of the first surface not in contact with an upper surface of the other semiconductor chip, a projected section having thickness of the bonding layer larger than thickness of the bonding layer in a second region that is in contact with the other semiconductor chip,
    wherein thickness of the bonding layer in the projected section is thickness for setting the projected section in contact with the substrate.

12. The manufacturing apparatus for a semiconductor device according to claim 11, wherein a side surface of the projected section is in contact with a side surface of the other semiconductor chip.

13. The manufacturing apparatus for a semiconductor device according to claim 11, wherein
    the projected section is formed to avoid an outer edge section of the semiconductor chip in plan view.

14. The manufacturing apparatus for a semiconductor device according to claim 11, wherein
    an electrode pad is formed on a second surface, which is an opposite surface of the first surface, of the semiconductor chip,
    the projected section is formed in a region right under the electrode pad.

* * * * *